United States Patent
Lee et al.

(10) Patent No.: US 12,020,966 B2
(45) Date of Patent: Jun. 25, 2024

(54) TRANSPORT VEHICLE FOR SUPPRESSING VIBRATION OF GOODS, AND GOODS TRANSPORT SYSTEM INCLUDING SAME VEHICLE AND FOR USE IN MANUFACTURING PLANT

(71) Applicant: SEMES CO., LTD., Cheonan-si (KR)

(72) Inventors: Jun Beom Lee, Hwaseong-si (KR); In Sung Choi, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 362 days.

(21) Appl. No.: 17/553,822

(22) Filed: Dec. 17, 2021

(65) Prior Publication Data

US 2022/0199441 A1 Jun. 23, 2022

(30) Foreign Application Priority Data

Dec. 18, 2020 (KR) ........................ 10-2020-0178504

(51) Int. Cl.
*H01L 21/677* (2006.01)
*B66C 13/06* (2006.01)
*H03H 17/06* (2006.01)

(52) U.S. Cl.
CPC ...... *H01L 21/67724* (2013.01); *B66C 13/063* (2013.01); *H01L 21/6773* (2013.01); *H01L 21/67733* (2013.01); *H03H 17/0657* (2013.01)

(58) Field of Classification Search
CPC ......... H01L 21/67724; H01L 21/67733; H01L 21/6773; H03H 17/0657; B66C 13/063
See application file for complete search history.

(56) References Cited

U.S. PATENT DOCUMENTS 6,460,711 B1 * 10/2002 Kato ................... B66C 13/063
                                                    212/275
9,758,310 B2    9/2017 Murao
(Continued)

FOREIGN PATENT DOCUMENTS

JP         2006315813 A  * 11/2006
KR   10-2009-0128036      12/2009
(Continued)

OTHER PUBLICATIONS

JP 2006315813A Machine Translation (Year: 2006).*
(Continued)

*Primary Examiner* — Michael R Mansen
*Assistant Examiner* — Juan J Campos, Jr.

(57) ABSTRACT

Proposed is a transport vehicle including a traveling unit being moved along a first direction, a slide unit being driven for sliding in a second direction vertical to the first direction, a hand unit ascending and descending by a hoist combined with the slide unit and gripping the goods, and a control unit controlling driving of the traveling unit for traveling or driving of the slide unit for sliding, wherein the control unit applies a filter signal to an initial slide control signal for driving for sliding and controls driving of the hand unit for sliding through a drive control signal for sliding to which the filter signal is applied, and the filter signal includes a plurality of impulse signals and an interval between the impulse signals is determined as a value corresponding to a length of the hoist in linear interpolation on pre-stored period values on a per-hoist-length basis.

20 Claims, 11 Drawing Sheets

(56) References Cited

U.S. PATENT DOCUMENTS

| | | | |
|---|---|---|---|
| 10,280,048 B2 | 5/2019 | Fakkeldij et al. | |
| 2009/0035104 A1* | 2/2009 | Onishi | H01L 21/67294 |
| | | | 700/47 |
| 2013/0197691 A1* | 8/2013 | Tsubaki | H01L 21/68707 |
| | | | 700/228 |
| 2017/0323817 A1* | 11/2017 | Kobayashi | H01L 21/67712 |
| 2019/0217873 A1* | 7/2019 | Imahori | B61B 3/00 |

FOREIGN PATENT DOCUMENTS

| | | |
|---|---|---|
| KR | 10-2017-0084697 | 7/2017 |
| KR | 10-1841410 | 3/2018 |

OTHER PUBLICATIONS

KR 20090128036A Machine Translation (Year: 2009).*
KR 20170084697A Machine Translation (Year: 2017).*
KR 20170106482A Machine Translation (Year: 2017).*
Office Action from the Korean Intellectual Property Office dated Jan. 16, 2023.

* cited by examiner

[ORIGINAL VELOCITY PROFILE]

* 
[VIBRATION DAMPING FILTER]

= 
[FILTER-APPLIED VELOCITY PROFILE]

| PENDULUM LENGTH | $l_1$ | $l_2$ | $l_3$ | $l_4$ |
|---|---|---|---|---|
| SWING PERIOD | $T_1$ | $T_2$ | $T_3$ | $T_4$ |

$$T_A = \frac{T_2 - T_1}{l_2 - l_1} \times l_A + T_1$$

TRANSPORT VEHICLE FOR SUPPRESSING VIBRATION OF GOODS, AND GOODS TRANSPORT SYSTEM INCLUDING SAME VEHICLE AND FOR USE IN MANUFACTURING PLANT

CROSS REFERENCE TO RELATED APPLICATION

The present application claims priority to Korean Patent Application No. 10-2020-0178504, filed Dec. 18, 2020, the entire contents of which is incorporated herein for all purposes by this reference.

BACKGROUND OF THE INVENTION

Field of the Invention

The present disclosure relates to a transport vehicle for suppressing vibration of goods and a goods transport system for use in a manufacturing plant, the system including the transport vehicle.

Description of the Related Art

Semiconductor (display) manufacturing processes are for forming a semiconductor element on a substrate (for example, a wafer) and include, for example, light exposure, deposition, etching, ion implantation, cleaning, packaging, and the like. A manufacturing factory for manufacturing the semiconductor element has clean rooms installed on one or more floors, and pieces of manufacturing equipment for performing the semiconductor manufacturing processes are arranged in the clean room on each of the floors.

Techniques for transporting goods (for example, substrates) from one piece of manufacturing equipment to another quickly and efficiently, as well as a method of improving each of the semiconductor manufacturing processes, have been introduced in order to maximize the efficiency of the semiconductor manufacturing processes. Typically, an overhead hoist transport (OHT) system in which goods are transported along a path provided on a ceiling of the semiconductor manufacturing factory has found wide application. Normally, the OHT system includes a rail constituting a traveling path and a transport vehicle transporting goods while traveling along the rail. In addition, in a case where there is a need to retain goods during transportation from one piece of semiconductor manufacturing equipment to another, a storage system for storing the goods may be provided.

The transport vehicle travels and stops to perform an allocated job of loading and unloading goods. The transport vehicle repeatedly performs this stop-and-go operation. In addition, a hand unit capable of gripping the goods is enabled to ascend and descend to load and unload the goods onto and from the transport vehicle. At this time, through a hoist belt, a slide unit enables the hand unit to ascend and descend.

In order to increase a speed at which the goods are loaded and unloaded onto and from the transport vehicle, the goods may be damaged due to vibration of a hoist in a forward-to-backward direction or in a leftward-to-rightward direction in a case where a driving speed for sliding is increased or where a traveling speed is increased.

The foregoing is intended merely to aid in the understanding of the background of the present disclosure, and is not intended to mean that the present disclosure falls within the purview of the related art that is already known to those skilled in the art.

SUMMARY OF THE INVENTION

An objective of the present disclosure is to provide a transport vehicle capable of increasing a traveling speed and at the same time suppressing vibration occurring on goods and a goods transport system including the transport vehicle, the goods transport system being for use in a manufacturing plant.

The present disclosure is not limited to the objective described above. From the following description, other objectives that are not described above will be clearly understood by a person of ordinary skill in the art.

According to an aspect of the present disclosure, there is provided a transport vehicle transporting goods in a goods transport system for use in a manufacturing plant, the transport vehicle including: a traveling unit being moved along a first direction; a slide unit being driven for sliding in a second direction vertical to the first direction; a hand unit ascending and descending by a hoist combined with the slide unit and gripping the goods; and a control unit controlling driving of the traveling unit for traveling or driving of the slide unit for sliding. In the transport vehicle, the control unit applies a filter signal to an initial slide control signal for driving for sliding and controls driving of the hand unit for sliding through a drive control signal for sliding to which the filter signal is applied, and the filter signal includes a plurality of impulse signals and an interval between the impulse signals is determined as a value corresponding to a length of the hoist in linear interpolation on pre-stored period values on a per-hoist-length basis.

In the transport vehicle, the hoist may be configured as a plurality of hoist belts.

In the transport vehicle, the control unit may generate the slide drive control signal by performing a convolution operation of the filter signal on the initial slide control signal.

In the transport vehicle, the period value on a per-hoist-length basis may be pre-stored in a format of a table showing period values for a plurality of hoist lengths.

In the transport vehicle, the interval of the impulse signals may be determined by linear interpolation on a first period value for a first hoist length and a second period value for a second hoist length, the first and second period values being pre-stored.

In the transport vehicle, the first hoist length may correspond to a value lower than a value corresponding to the length of the hoist in the table, and the second hoist length may correspond to a value higher than the value corresponding to the length of the hoist in the table.

In the transport vehicle, the interval between the impulse signals may be determined by the following Equation:

$$T_A = \frac{T_2 - T_1}{l_2 - l_1} \times l_A + T_1$$

where $T_A$ is the interval between the impulse signals, $T_1$ is the first period value, $T_2$ is the second period value, $l_1$ is the first hoist length, $l_2$ is the second hoist length, and $l_A$ is the length of the hoist.

According to another aspect of the present disclosure, there is provided a transport vehicle transporting goods in a goods transport system for use in a manufacturing plant, the transport vehicle including: a traveling unit be moved along a first direction; a slide unit being driven for sliding in a second direction vertical to the first direction; a hand unit ascending and descending by a hoist combined with the slide unit and gripping the goods; and a control unit controlling driving of the traveling unit for traveling or driving of the slide unit for sliding, In the transport vehicle, the control unit applies a filter signal to an initial traveling control signal for the driving for traveling and controls the driving of the traveling unit for traveling through a drive control signal for traveling to which the filter signal is applied, and the filter signal includes a plurality of impulse signals, and an interval between the impulse signals is determined as a value corresponding to a length of the hoist in linear interpolation on pre-stored period values on a per-hoist-length basis.

According to still another aspect of the present disclosure, there is provided a goods transport system for use in a manufacturing plant, the goods transport system including: a rail providing a path for transporting goods; and a transport vehicle transporting the goods while traveling along the rail. In the goods transport system, the transport vehicle includes: a traveling unit being moved along a first direction; a slide unit being driven for sliding in a second direction vertical to the first direction; a hand unit ascending and descending by a hoist configured as a plurality of hoist belts combined with the slide unit and gripping the goods; and a control unit controlling driving of the traveling unit for traveling or driving of the slide unit for sliding. In the transport vehicle, the control unit applies a filter signal to an initial slide control signal for driving for sliding and controls driving of the hand unit for sliding through a drive control signal for sliding to which the filter signal is applied, and the filter signal includes a plurality of impulse signals, and an interval between the impulse signals is determined as a value corresponding to a length of the hoist in linear interpolation on pre-stored period values on a per-hoist-length basis.

According to an embodiment of the present disclosure, the vibration occurring when the transport vehicle is driven for loading and unloading the goods can be attenuated through the drive control signal to which the filter signal is applied.

In addition, according to an embodiment of the present disclosure, using the linear interpolation on the pr-stored period values on a per-hoist-length basis, the filter signal for suppressing the vibration can be rapidly generated according to characteristics of the hoist of the transport vehicle without complex computation.

The present disclosure is not limited to the above-described advantage. From the following description, other advantages that are not described above will be clearly understood by a person of ordinary skill in the art.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
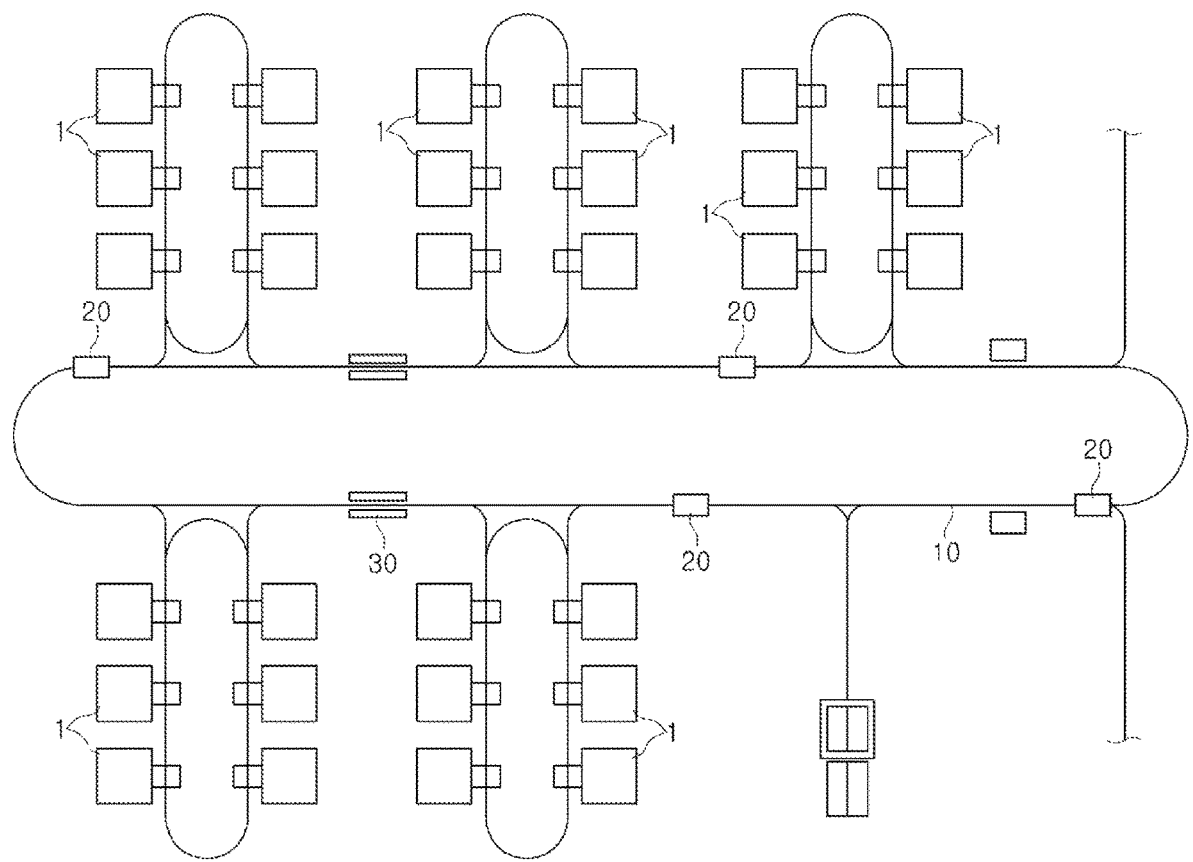
FIG. 1 is a view illustrating a schematic structure of a goods transportation system for a manufacturing plant according to an embodiment of the present disclosure.

Embodiments of the present disclosure will be described in detail below with reference to the accompanying drawings in such a manner that a person of ordinary skill in the art to which the present disclosure pertains is enabled to practice the embodiments thereof without undue experimentation. The present disclosure can be embodied in various forms and is not limited to the embodiments described below.

Descriptive material deemed superfluous or unessential for a clear understanding of the present disclosure is omitted, and the same or similar constituent elements are given the same reference numeral throughout the specification.

In addition, in a case where various embodiments have a constituent element having the same configuration, such a constituent element is described only in a representative embodiment using the same reference numeral. Only a constituent element different in configuration from that in the representative is described in an embodiment other than the representative embodiment.

When a constituent element is referred to as being "connected" to (or combined with) one other constituent element, this constituent element may be "directly connected" to (or directly combined with) one other constituent element or may be "indirectly connected" to (or indirectly combined with) one other constituent element with an intervening constituent element interposed therebetween. When the expression "includes a constituent element" is used, unless otherwise particularly described, this expression means "further includes any other constituent element, not "excludes any other constituent element".

Unless otherwise defined, all terms including technical and scientific terms, which are used in the present specification, have the same meanings as are normally understood by a person of ordinary skill in the art to which the present disclosure pertains. The term as defined in a dictionary in general use should be construed as having the same meaning as interpreted in context in the relevant technology, and, unless otherwise explicitly defined in the present specification, is not construed as having an ideal meaning or an excessively-formal meaning.

FIG. 1 is a view illustrating a schematic structure of a goods transportation system for a manufacturing plant according to an embodiment of the present disclosure. A semiconductor or display manufacturing line is configured to be established in one or more clean rooms, and pieces of manufacturing equipment 1 that perform manufacturing processes may be installed in each cleaning room. Normally, a plurality of manufacturing processes are sequentially performed on a substrate (for example, a wafer), and thus the finally-processed substrate is obtained. That is, when a manufacturing process on the substrate is finished in a specific piece of semiconductor manufacturing equipment 1, the substrate is transported to another for the next manufacturing process. The substrate here may be transported in a state of being retained in a receptacle (for example, a front opening unified pod (FOUP)) capable of accommodating a plurality of substrates. The receptacle accommodating the substrates may be transported by a transport vehicle 20 (for example, an overhead hoist transport (OHT).

The transport vehicle 20 travels along a rail 10 installed on a ceiling and has a wireless interface to communicate with a high-level server (a vehicle control apparatus) providing a transporting operation command. The vehicle control apparatus receives a command for transportation in accordance with an operating process from an integrated control system. According to a command of an integrated control system, the vehicle control apparatus searches for the shortest path from a starting point to a destination to finish a transporting operation in the least amount of time and selects the transport vehicle 20 positioned at an optimal position for performing a transporting operation. Then, the vehicle control apparatus provides a transporting command to the selected transport vehicle 20. According to the transporting command of the vehicle control apparatus, the transport vehicle 20 transports goods from an arbitrary port to a destination port. The arbitrary port and the destination port are designated by the vehicle control apparatus.

With reference to FIG. 1, the pieces of manufacturing equipment 1 for performing processes are installed in the semiconductor or display manufacturing line. The rail 10 and a plurality of transport vehicles 20 may be provided. The rail 10 forms a transporting path (for example, a ceiling rail) for transporting goods from one piece of manufacturing equipment 1 to another. The plurality of transport vehicles 20 transport the goods to one piece of manufacturing equipment 1 to another while traveling along the rail 10. At this point, the transport vehicle 20 transporting the goods may receive its motive power through an electricity supply unit (for example, a power supply cable) provided along the rail 10.

When the transport vehicle 20 transports goods from one piece of manufacturing equipment 1 to another, the goods may be transported from a specific piece of manufacturing equipment to another. After stored in a storage apparatus, the goods may be transported to another piece of manufacturing equipment. The storage apparatus (for example, a goods retention unit 30) may be installed to one side of the rail 10. The storage apparatus may include a stocker and a buffer that is adjacent to a flank surface of the rail 10 or a buffer that is under the rail 10. The stocker in the foam of a rack is capable of injecting inert gas to keep the inside of the receptacle clean. The buffer that is adjacent to the flank surface of the rail 10 is mounted adjacent to the flank surface of the rail 10 and retains goods. The buffer that is under the rail 10 is mounted under the rail 10 and retains the goods. In addition, a maintenance and repair lifter for maintaining and repairing the transport vehicle may be provided.

Figure 2:
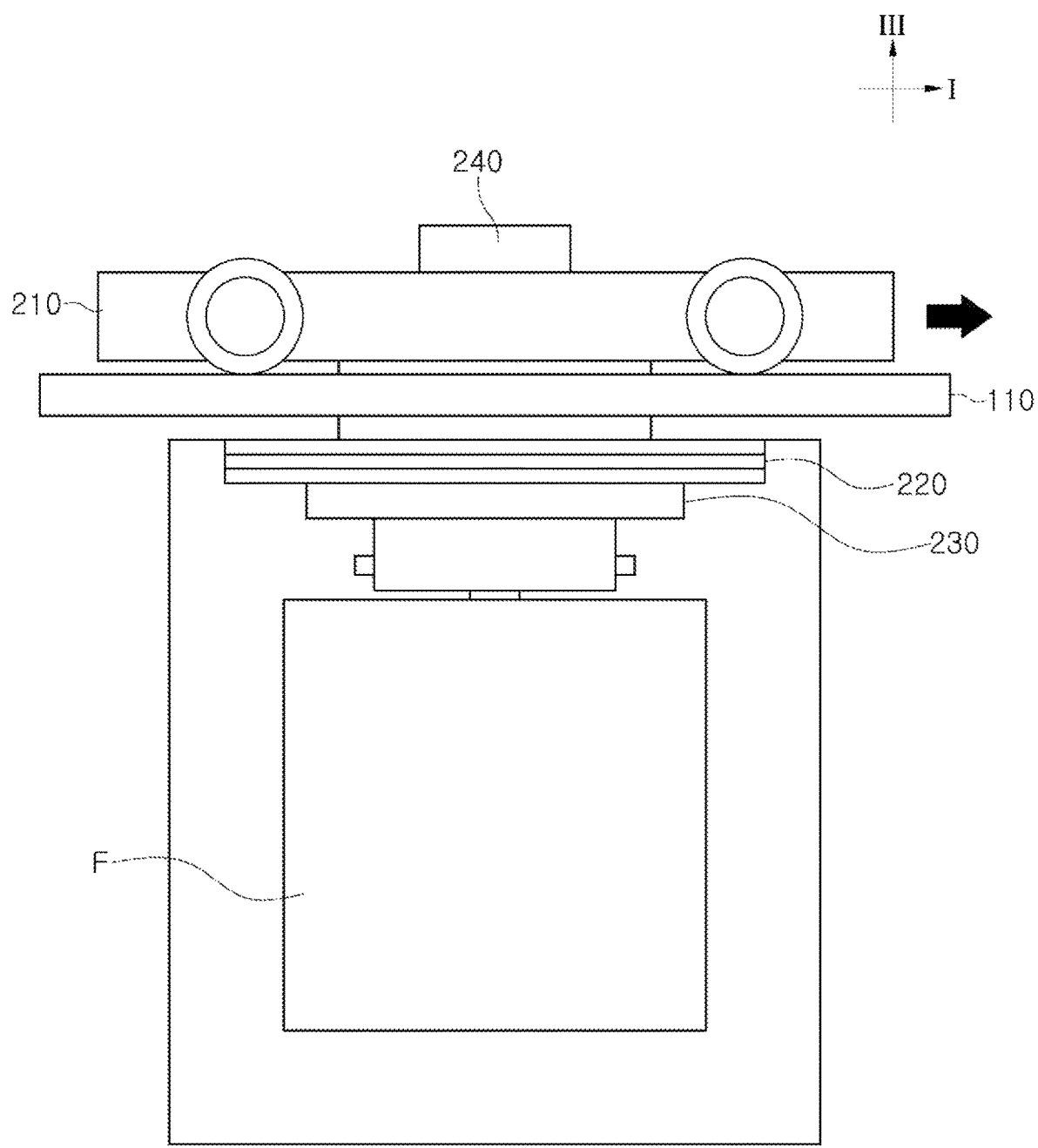
FIGS. 2 to 5 are views each illustrating a schematic structure of a transport vehicle according to an embodiment of the present disclosure.
Figure 3:
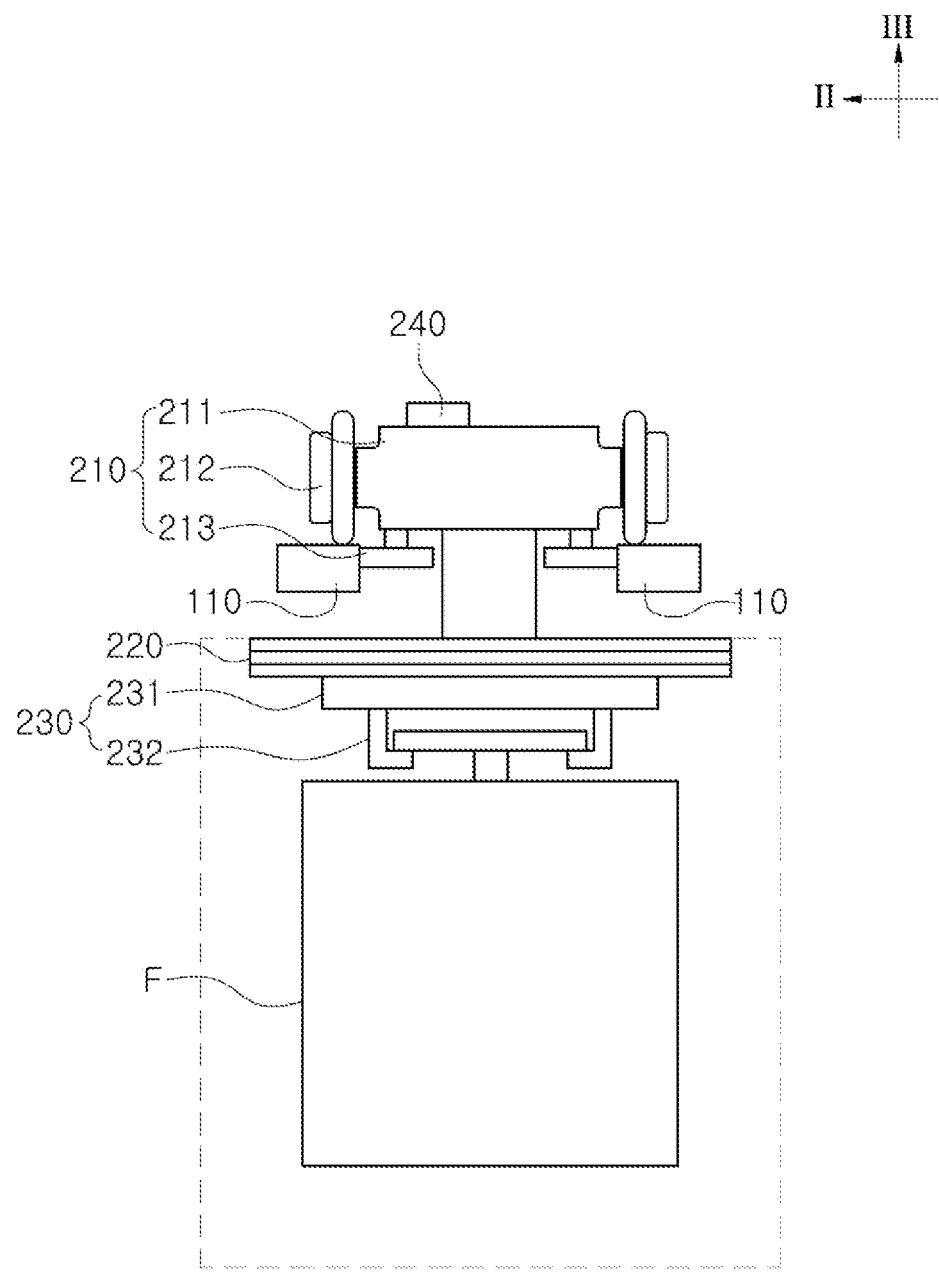
Figure 4:
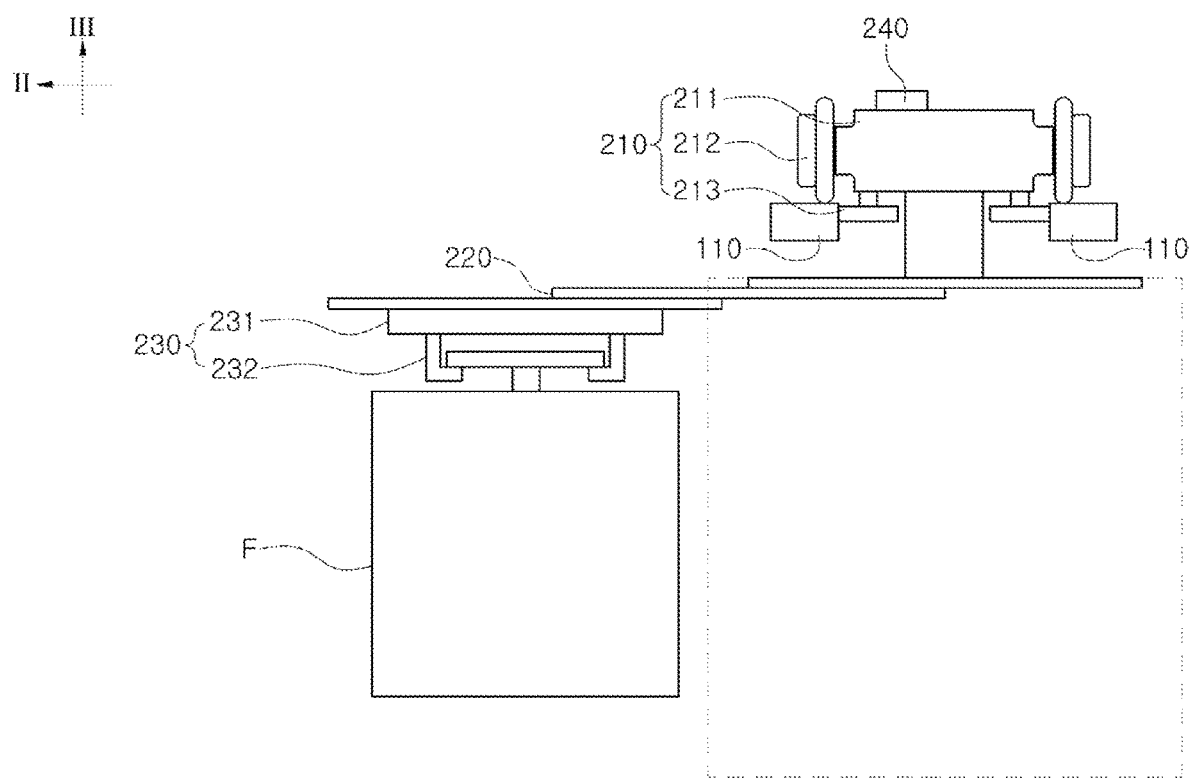
Figure 5:
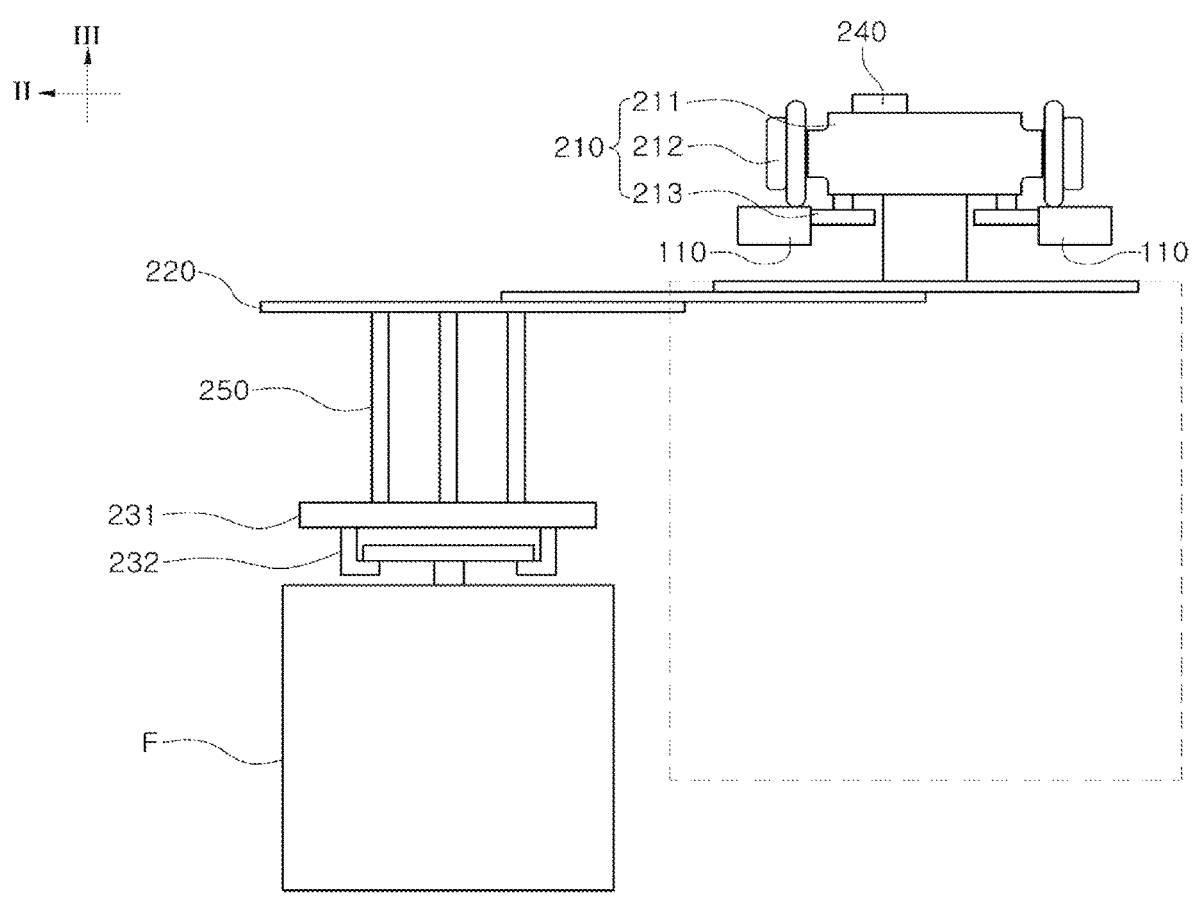

FIGS. 2 to 5 are views each illustrating the transport vehicle 20 according to the embodiment of the present disclosure. FIG. 2 illustrates the transport vehicle 20 when viewed from a front surface of a traveling path. FIGS. 3 to 5 illustrate the transport vehicle 20 when viewed from a flank surface of the traveling path. FIG. 3 illustrates a case where a slide unit 220 of the transport vehicle 20 is positioned at a retention position. FIG. 4 illustrates a case where the slide unit 220 of the transport vehicle 20 is driven for sliding and then is positioned at a loading and unloading position. FIG. 5 illustrates a case where a hoist 250 descends from the slide unit 220 of the transport vehicle 20.

With reference to FIGS. 2 to 5, the transport vehicle 20 includes a traveling unit 210, a slide unit 220, a hand unit 230, and a control unit 240. The traveling unit 210 is moved along a first direction I. The slide unit 220 is driven for sliding in a second direction II vertical to the first direction I. The hand unit 230 ascends and descends by the hoist 250 combined with the slide unit 220 and grips goods F. The control unit 240 includes a traveling controller controlling driving of the traveling unit 210 for traveling and a slide controller controlling driving of the slide unit 220 for sliding.

The traveling unit 210 includes a drive body 211, a traveling wheel 212, and a traveling guide wheel 213. Devices necessary for the transport vehicle 20 to travel are mounted on the drive body 211. The traveling wheel 212 is brought into contact with a traveling rail 110 and is rotated. The traveling guide wheel 213 is brought into a flank surface of the traveling rail 110 and is rotated. The transport vehicle 20 travels along the traveling rail 110 by the rotation of the traveling wheel 212. The traveling guide wheel 213 may prevent the transport vehicle 20 from deviating from the traveling rail 110.

The slide unit 220 may be driven for sliding in the second direction II (or in a direction opposite to the second direction) in order to load and unload the goods F. The slide unit 220 is combined with the hand unit 230 through the hoist 250 and may enable the hand unit 230 to descend to a goods loading and unloading position. The slide unit 220 may be configured to include multi-step sliding blocks and a stopper.

The hand unit 230 may grip the goods F and then may keep the goods F. Alternatively, the hand unit 230 may release the goods F and then may stably place the goods F onto a loading position. The hand unit 230 may include a gripper 232 and a gripper drive unit 231. The gripper 232 is formed in such a manner as to be hung on flange portions of the goods F. The gripper drive unit 231 is fixed to the hoist 250 and serves to horizontally move a gripper 232 (i.e., a grip hand). According to the embodiment of the present disclosure, the hoist 250 may be configured as a plurality of hoist belts. For example, the hoist 250 may be configured as three hoist belts. The three hoist belts are connected to three points, respectively, on the hand unit 230 that determines a unique triangle, and thus the hand unit 230 is enabled to ascend and descend.

The control unit 240 may control overall operations of enabling the transport vehicle 20 to travel and loading and unloading the goods F. The control unit 240 according to the embodiment of the present disclosure may include the traveling controller controlling the driving of the traveling unit 210 for traveling and the slide controller controlling the driving of the slide unit 220 for sliding. The control unit 240 may be realized by one or more processors.

Steps of transporting general goods F are as follows. First, the transport vehicle 20 is moved to a starting position at which the completely processed goods F are positioned. The transport vehicle 20 comes to a stop at the starting position. Then, the slide unit 220 of the transport vehicle 20 is slid in a sideways direction (for example, in the second direction). Through the hoist 250, the hand unit 230 is enabled to ascend. The hand unit 230 grips the goods F. The transport vehicle 20 enables the hand unit 230 gripping the goods F to ascend and drives the slide unit 220 in such a manner as to return to an original position thereof. The transport vehicle 20 gripping the goods F is moved to a target position and comes to a stop at the target position. The transport vehicle 20 that arrives at the target position drives the slide unit 220 for sliding in the sideways direction (for example, in the second direction). Through the hoist 250, the transport vehicle 20 enables the hand unit 230 to descend and then stably places the goods F onto the target position. Subsequently, through the hoist 250, the transport vehicle 20 enables the hand unit 230 to ascend, and drives the slide unit 220 in the reverse direction in such a manner as to return to the original position thereof.

When the goods F are transported more quickly, or whenever necessary, in a state where the hoist 250 is expanded and where the goods F are positioned below, the slide unit 220 may be driven for sliding or the traveling unit 210 may be enabled to travel. However, in the state where the hoist 250 is expanded and where the goods F are positioned below, in a case where the slide unit 220 or the traveling unit 210 is driven, the goods F may be vibrated (swung) while the slide unit 220 or the traveling unit 210 accelerates or decelerates. The goods F that are transported by the transport vehicle 20 in a semiconductor or display manufacturing plant are receptacles for retaining a substrate. When vibration occurs on the goods F, substrates retained in the goods F may be damaged.

In order to deal with this problem, there is provided a method of reducing the vibration of the goods F that occurs while driving the slide unit 220 or the traveling unit 210. According to the embodiment of the present disclosure, a vibration damping filter may be used for a control signal for driving the slide unit 220 or the traveling unit 210, and thus the vibration may be attenuated. In addition, a period value of a vibration damping filter signal on a per-hoist-length basis is stored in advance considering characteristics of the hoist 250 that is configured as a plurality of belts in the transport vehicle 20. A value corresponding to an actual hoist length may be determined as a period of the vibration damping filter signal in linear interpolation on period values on a per-hoist-length basis. A method of generating and applying a drive control signal according to an embodiment of the present disclosure will be described below.

Figure 6:
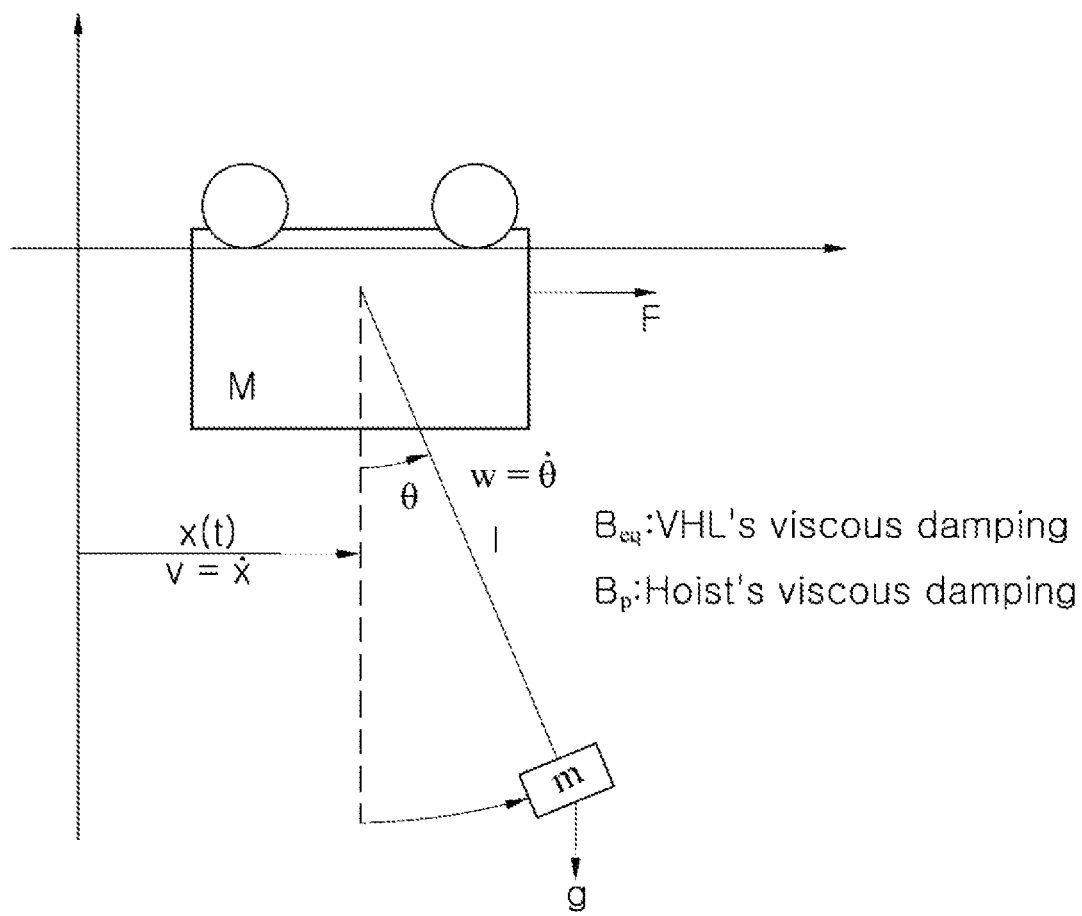
FIG. 6 is a view illustrate a result of modeling the transport vehicle that travels in a state where a hoist ascends.

FIG. 6 is a view illustrating a result of modeling the transport vehicle 20 that travels in a state where the hoist 250 ascends. Swings of the hand unit 230 in the transport vehicle 20 may include a swing in a longitudinal-axis direction of the transport vehicle 20 due to traveling at an accelerated or decelerated velocity and a swing in a traverse-axis direction of the slide unit 220 due to driving for sliding. FIG. 6 is a view illustrating the swing in the longitudinal direction. The same principle applies to the swing in the traverse direction.

A system as in FIG. 6 may be expressed as an equation for dynamics, such as following Equation 1.

$$\begin{cases} (M+m)\ddot{x} + ml\ddot{\theta}\cos\theta - ml\dot{\theta}^2\sin\theta = u \\ ml\ddot{x}\cos\theta + ml^2\ddot{\theta} + mgl\sin\theta = 0 \end{cases}$$ [Equation 1]

Linearization of Equation 1 at a point having a swing angle of 0 is expressed as following Equation 2.

$$\ddot{x} = \frac{mg}{M}\theta - \frac{B_{eq}}{M}\dot{x} - \frac{mB_p}{M}\dot{\theta} + \frac{1}{M}F$$ [Equation 2]

-continued
$$\ddot{\theta} = -\frac{(M+m)g}{Ml}\theta + \frac{B_{eq}}{Ml}\dot{x} - \frac{(M+m)B_p}{Ml}\dot{\theta} - \frac{1}{Ml}F$$

In the linearization, a natural frequency of the swing may be expressed as following Equation 3.

$$w_n = \sqrt{\frac{(M+m)g}{Ml}}$$ [Equation 3]

where $W_n$ is a natural vibration frequency of the swing of the hoist 250.

The subject described above may be defined as equations of state, such as following Equations 4 and 5.

$$\dot{x}(t) = Ax(t) + Bu(t)$$ [Equation 4]
$$y(t) = Cx(t)$$
$$x = [x \ \theta \ v \ w]^T$$

$$A = \begin{bmatrix} 0 & 0 & 1 & 0 \\ 0 & 0 & 0 & 1 \\ 0 & \frac{mg}{M} & -\frac{B_{eq}}{M} & -\frac{mB_p}{M} \\ 0 & \frac{-(M+m)g}{Ml} & \frac{B_{eq}}{Ml} & \frac{-(M+m)B_p}{Ml} \end{bmatrix}$$ [Equation 5]

$$B = [0 \ 0 \ 1/M \ -1/Ml]^T$$
$$C = [1 \ 0 \ 1 \ 0]$$
$$u(t) = F$$

Figure 7:
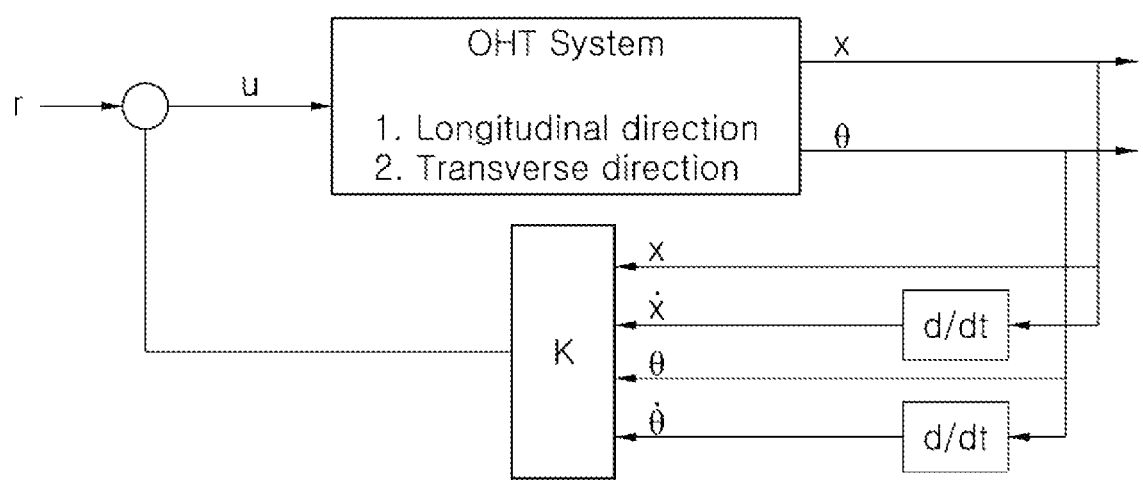
FIG. 7 is a block diagram illustrating a system for controlling a swing of a hand unit in the transport vehicle.

FIG. 7 is a block diagram of a system for controlling the swing of the hand unit 230 in the transport vehicle 20. As described above, the swings of the hand unit 230 of the transport vehicle 20 according to the embodiment of the present disclosure include a swing in the longitudinal-axis direction of the traveling unit 210 due to the traveling at an accelerated or decelerated velocity and the swing in the traverse-axis direction of the slide unit 220 due to the driving for sliding. In the case of the swing of the traveling unit 210 due to the traveling at an accelerated or decelerated velocity, x may correspond to a traveling distance in the longitudinal-axis direction, and θ may correspond to a swing angle in the longitudinal-axis direction of the hand unit 230. In the case of the swing of the slide unit 220 due to the driving for sliding, x may correspond to a traveling distance in the traverse-axis direction, and θ may correspond to a swing angle in the traverse-axis direction of the hand unit 230.

According to the embodiment of the present disclosure, the control unit 240 may apply a filter signal to an initial slide control signal for driving for sliding (i.e., may perform convolution on the initial slide control signal with the filter signal or may combine the initial slide control signal with the filter signal) and may control the driving of the slide unit 220 for sliding using a slide control signal generated from the convolution operation. For example, the control unit 240 may combine the filter signal with the initial slide control signal to generate the slide control signal which will be applied to the slide unit 220. In addition, the control unit 240 may apply the filter signal to an initial traveling control signal for driving for traveling (i.e., may perform convolution on the initial traveling control signal with the filter signal or may combine the initial traveling control signal with the filter signal) and may control the driving of the traveling unit 210 for traveling using a traveling control signal generated from the convolution operation. For example, the control unit 240 may combine the filter signal with the initial traveling control signal to generate the traveling control signal which will be applied to the traveling unit 210.

Figure 8:
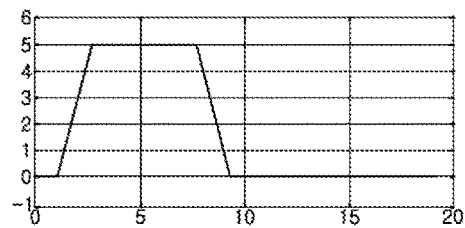
FIG. 8 is a view illustrating a process of using a vibration damping filter according to the embodiment of the present disclosure.
Figure 8:
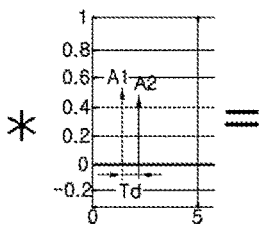
Figure 8:
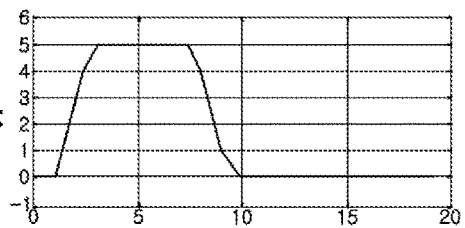

FIG. 8 is a view illustrating a process of applying the filter signal according to the embodiment of the present disclosure. According to the embodiment of the present disclosure, the filter signal may include a plurality of impulse signals. As illustrated in FIG. 8, the filter signal that is applied as the vibration damping filter is defined by two impulse signals A1 and A2 and an interval Td between the impulse signals. The impulse signals A1 and A2 are determined according to the characteristics of the hoist 250, an attenuation ratio, or an experimental result.

Thus, the equations A1+A2=1 and A1−A2=(magnitude of vibration attenuation) are obtained. For example, in the filter signal, the two impulse signals A1 and A2 are set such that the sum of each of the two impulse signals A1 and A2 is 1, and the difference of their magnitude may mean the magnitude of vibration attenuation. The interval Td is half of a period of natural vibration (half of a swing period) as defined in following Equation 6.

$$w_n = \sqrt{\frac{(M+m)g}{Ml}} \quad \text{[Equation 6]}$$

where $W_n$ is a natural vibration frequency of the swing of the hoist 250.

As illustrated in FIG. 8, the drive control signal may be generated by applying overlap integral of the filter signal, that is, a convolution operation to an initial control signal of the transport vehicle 20. That is, the control unit 240 may generate the drive control signal for sliding by performing the convolution operation of the filter signal on the initial slide control signal. In addition, the control unit 240 may be set to generate the drive control signal for traveling by performing the convolution operation of the filter signal on the initial traveling control signal.

In a case where the driving of the transport vehicle 20 is controlled using an initial control signal having a linear feature, an amount of the swing of the hand unit 230 is very large. In a case where the transport vehicle 20 is driven through a drive signal to which the filter signal according to the embodiment of the present disclosure is applied, the amount of the swing of the hand unit 230 is much decreased, and at the same time a motion delay due to the filter is also reduced. When the control signal is applied for the traveling of the traveling unit 210 at an accelerated or decelerated velocity or for the driving of the slide unit 220 for sliding, the swing of the hand unit 230 may be significantly reduced.

Figure 9:
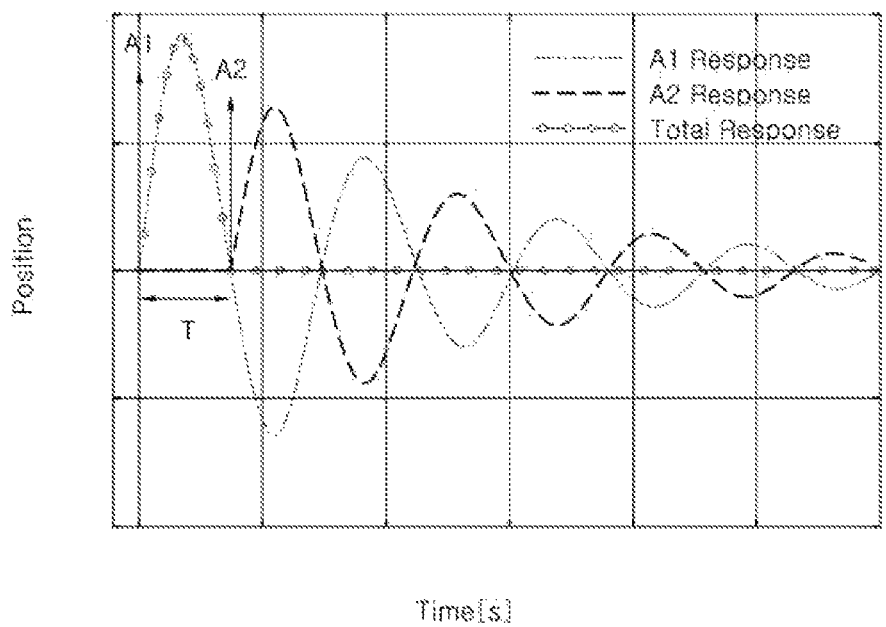
FIG. 9 is a view illustrating a position, a speed, an amount of vibration of the transport vehicle according to the control signal for which the vibration damping filter according to the embodiment of the present disclosure is used.

FIG. 9 is a view illustrating the filter signal that is used as the vibration damping filter according to the embodiment of the present disclosure. As illustrated in FIG. 9, the filter signal is defined as two impulse signals A1 and A2 and an interval T of the impulse signals. A swing attenuation principle according to the present disclosure is that, as illustrated in FIG. 9, a response by a first impulse signal A1 and a response by a second impulse signal A2 attenuate each other, thereby suppressing overall vibration. A period T of a general pendulum motion is determined by a length I of the hoist 250 as in following Equation 7.

$$T = 2\pi\sqrt{\frac{l}{g}} \quad \text{[Equation 7]}$$

Figure 10:
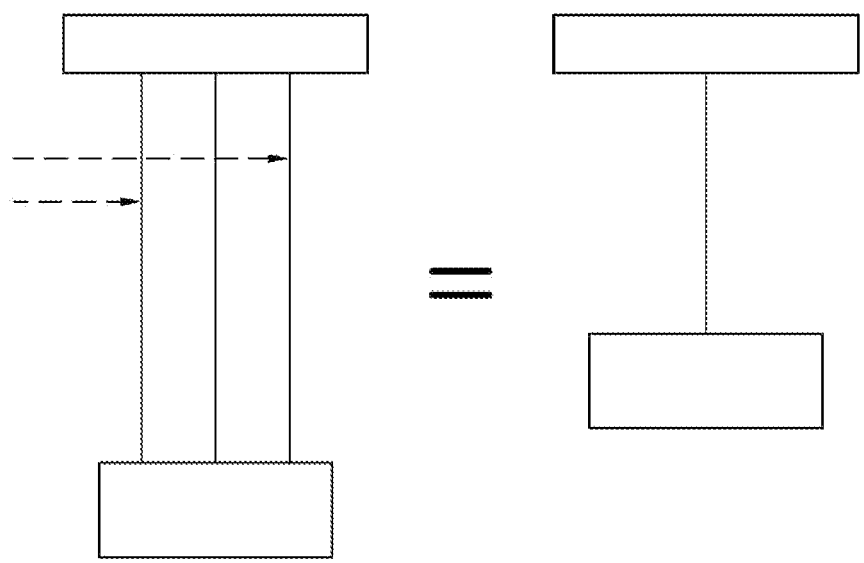
FIG. 10 is a view illustrating a modeling process that is performed considering characteristics of the transport vehicle.

However, as illustrated in FIGS. 2 to 5, in a case where the hoist 250 of the transport vehicle 20 is configured as a plurality of hoist belts (for example, three hoist belts), the swing period is not simply determined by only a length of the hoist 250. For example, in a case where the hoist 250 is configured as three hoist belts, the three hoist belts interact with each other. Thus, the pendulum motion becomes fast, and a period of the pendulum motion is shortened. That is, as illustrated in FIG. 10, the hoist 250 configured as the three hoist belts has the same period as the hoist 250 that actually has a shorter length. Therefore, when the filter signal is simply generated considering only the length of the hoist 250 as in Equation 7, suitable performance cannot be obtained.

Figure 11:
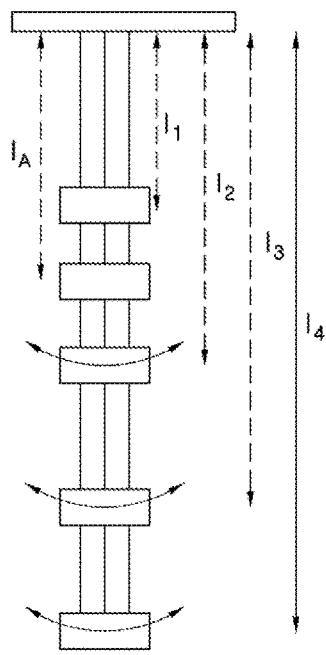
FIG. 11 is a view a process for computing a period of a filter signal using a relationship between period values on a per-hoist-length basis according to the embodiment of the present disclosure.

Therefore, according to the embodiment of the present disclosure, a period value suitable for each length of the hoist 250 is stored in the table format, considering the characteristics of the hoist 250 of the transport vehicle 20. The filter signal may be configured using the period value corresponding to the length of the actual hoist 250. For example, as in FIG. 11, swing periods $T_1$, $T_2$, T3, and T4 that correspond to predetermined hoist lengths $l_1$, $l_2$, l3, and l4, respectively, are stored in the table format. For example, a table may include a plurality of entries, each entry including a plurality of hoist lengths and a corresponding swing period for each of the plurality of hoist lengths. Interpolation is performed on the swing periods on a per-hoist-length basis to obtain a period value for the actual hoist 250. For example, wherein the period value may be determined by linear interpolation of a plurality of pre-stored period values including the swing periods T1, T2, T3, and T4. Each of the plurality of pre-stored period values represents a swing period value of a pendulum motion of a corresponding hoist length among a plurality of hoist lengths including the hoist lengths including the hoist lengths $l_1$, $l_2$, l3, and l4.

Then, the filter signal may be configured by applying the period value corresponding to the length of the actual hoist 250. That is, the period value on a per-hoist-length basis may be pre-stored, in a format of a table showing period values for a plurality of host lengths, in the control unit 240 of the transport vehicle 20.

An interval $T_A$ between the impulse signal (the swing period) in the filter signal may be defined as in following Equation 8.

$$T_A = \frac{T_2 - T_1}{l_2 - l_1} \times l_A + T_1 \quad \text{[Equation 8]}$$

According to the embodiment of the present disclosure, the interval $T_A$ between the impulse signals A1 and A2 is determined by linear interpolation on a first period value $T_1$ for a first hoist length $l_1$ and a second period value $T_2$ for a second hoist length $l_2$, the first and second period values being pre-stored. In Equation 8, the first hoist length $l_1$ corresponds to a value lower than a value corresponding to a length $l_A$ of the hoist 250 in a table, and the second hoist length $l_2$ corresponds to a value higher than the value corresponding to the length $l_A$ of the hoist 250 in the table.

The interval $T_A$ between the impulse signals A1 and A2 is determined by Equation 8 where $T_A$ is the interval between the impulse signals, $T_1$ is the first period value, $T_2$ is the second period value, $l_1$ is the first hoist length, $l_2$ is the second hoist length, and $l_A$ is the length of the hoist.

The above-described embodiments and the accompanying drawings are only exemplary results of embodying the technical idea of the present disclosure. It would be apparent that all modification examples and implementation examples that can be derived by a person of ordinary skill in the art from the specification and the drawings without departing from the scope of the technical idea of the present disclosure are included within the scope of the present disclosure.

Therefore, the technical idea of the present disclosure should not be limited to the embodiments described above. Not only subject matters claimed in claims, but also equivalents of and equivalent modifications to the subject matters should fall within the technical scope of the present disclosure.

What is claimed is:

1. A transport vehicle transporting goods in a goods transport system for use in a manufacturing plant, the transport vehicle comprising:
   a traveling unit configured to move along a first direction;
   a slide unit configured to slide in a second direction vertical to the first direction;
   a hand unit configured to:
     ascend or descend by a hoist combined with the slide unit, and
     grip the goods; and
   a control unit configured to:
     control the traveling unit to move along the first direction or the slide unit to slide in the second direction, and
     combine a filter signal with an initial slide control signal to generate a slide drive control signal for controlling the slide unit to ascend or descend the hand unit,
   wherein the filter signal includes two impulse signals,
   wherein an interval between the two impulse signals is determined as a period value corresponding to a length of the hoist,
   wherein the period value is determined by linear interpolation of a plurality of pre-stored period values, and
   wherein each of the plurality of pre-stored period values represents a swing period value of a pendulum motion of a corresponding hoist length among a plurality of hoist lengths.

2. The transport vehicle of claim 1,
   wherein the hoist includes a plurality of hoist belts.

3. The transport vehicle of claim 1,
   wherein the control unit is configured to generate the slide drive control signal by performing a convolution operation of the filter signal on the initial slide control signal.

4. The transport vehicle of claim 1,
   wherein the plurality of pre-stored period values are pre-stored in a format of a table having a plurality of entries, each entry including the plurality of hoist lengths and a corresponding period value for each of the plurality of hoist lengths.

5. The transport vehicle of claim 4,
   wherein the interval of the impulse signals is determined by performing linear interpolation on a first period value for a first hoist length and a second period value for a second hoist length, the first and second period values being pre-stored.

6. The transport vehicle of claim 5,
   wherein the first hoist length corresponds to a value lower than a value corresponding to the length of the hoist in the table, and
   wherein the second hoist length corresponds to a value higher than the value corresponding to the length of the hoist in the table.

7. The transport vehicle of claim 6,
   wherein the interval between the impulse signals is determined by the following Equation:

$$T_A = \frac{T_2 - T_1}{l_2 - l_1} \times l_A + T_1,$$

where $T_A$ is the interval between the impulse signals, $T_1$ is the first period value, $T_2$ is the second period value, $l_1$ is the first hoist length, $l_2$ is the second hoist length, and $l_A$ is the length of the hoist.

8. A transport vehicle transporting goods in a goods transport system for use in a manufacturing plant, the transport vehicle comprising:
   a traveling unit configured to move along a first direction;
   a slide unit configured to slide in a second direction vertical to the first direction;
   a hand unit configured to:
     ascend or descend by a hoist combined with the slide unit, and
     grip the goods; and
   a control unit configured to:
     control the traveling unit to move along the first direction or the slide unit to slide in the second direction, and
     combine a filter signal with an initial traveling control signal to generate a drive control signal for controlling the travelling unit,
   wherein the filter signal includes two impulse signals,
   wherein an interval between the two impulse signals is determined as a period value corresponding to a length of the hoist,
   wherein the period value is determined by linear interpolation of a plurality of pre-stored period values, and
   wherein each of the plurality of pre-stored period values represents a swing period value of a pendulum motion of a corresponding hoist length among a plurality of hoist lengths.

9. The transport vehicle of claim 8,
   wherein the hoist includes a plurality of hoist belts.

10. The transport vehicle of claim 8,
    wherein the control unit is configured to generate the drive control signal by performing a convolution operation of the filter signal on the initial traveling control signal.

11. The transport vehicle of claim 8,
    wherein the plurality of pre-stored period values are stored in a format of a table having a plurality of entries, each entry including the plurality of hoist lengths and a corresponding period value for each of the plurality of hoist lengths.

12. The transport vehicle of claim 11,
    wherein the interval of the impulse signals is determined by performing linear interpolation on a first period value for a first hoist length and a second period value for a second hoist length that are pre-stored.

13. The transport vehicle of claim 12,
wherein the first hoist length corresponds to a value lower than a value corresponding to the length of the hoist in the table, and
wherein the second hoist length corresponds to a value higher than the value corresponding to the length of the hoist in the table.

14. The transport vehicle of claim 13,
wherein the interval between the impulse signals is determined by the following equation:

$$T_A = \frac{T_2 - T_1}{l_2 - l_1} \times l_A + T_1$$

where $T_A$ is the interval between the impulse signals, $T_1$ is the first period value, $T_2$ is the second period value, $l_1$ is the first hoist length, $l_2$ is the second hoist length, and $l_A$ is the length of the hoist.

15. A goods transport system for use in a manufacturing plant, the goods transport system comprising:
a rail providing a path for transporting goods; and
a transport vehicle configured to travel along the rail and transport the goods,
wherein the transport vehicle comprises:
a traveling unit configured to move along a first direction;
a slide unit configured to slide in a second direction vertical to the first direction;
a hand unit configured to:
ascend or descend by a hoist including a plurality of hoist belts, wherein the hoist is combined with the slide unit, and
grip the goods; and
a control unit configured to:
control the traveling unit to move along the first direction or the slide unit to slide in the second direction, and
combine a filter signal with an initial slide control signal to generate a slide drive control signal for controlling the slide unit to ascend or descend the hand unit,
wherein the filter signal includes two impulse signals,
wherein an interval between the two impulse signals is determined as a period value corresponding to a length of the hoist,
wherein the period value is determined by linear interpolation of a plurality of pre-stored period values, and
wherein each of the plurality of pre-stored period values represents a swing period value of a pendulum motion of a corresponding hoist length among a plurality of hoist lengths.

16. The goods transport system of claim 15,
wherein the control unit is configured to generate the slide drive control signal by performing a convolution operation of the filter signal on the initial slide control signal.

17. The goods transport system of claim 15,
wherein the plurality of pre-stored period values are pre-stored in a format of a table having a plurality of entries, each entry including the plurality of hoist lengths and a corresponding period value for each of the plurality of hoist lengths.

18. The goods transport system of claim 17,
wherein the interval of the impulse signals is determined by performing linear interpolation on a first period value for a first hoist length and a second period value for a second hoist length that are pre-stored.

19. The goods transport system of claim 18,
wherein the first hoist length corresponds to a value lower than a value corresponding to the length of the hoist in the table, and
wherein the second hoist length corresponds to a value higher than the value corresponding to the length of the hoist in the table.

20. The goods transport system of claim 19,
wherein the interval between the impulse signals is determined by the following equation:

$$T_A = \frac{T_2 - T_1}{l_2 - l_1} \times l_A + T_1$$

where $T_A$ is the interval between the impulse signals, $T_1$ is the first period value, $T_2$ is the second period value, $l_1$ is the first hoist length, $l_2$ is the second hoist length, and $l_A$ is the length of the hoist.

* * * * *